United States Patent
Sasaki et al.

(10) Patent No.: US 7,049,223 B2
(45) Date of Patent: *May 23, 2006

(54) PASTE INCLUDING A MIXTURE OF POWDERS, CONNECTION PLUG, BURYING METHOD, AND SEMICONDUCTOR DEVICE MANUFACTURING METHOD

(75) Inventors: Keiichi Sasaki, Yokohama (JP);
Manabu Kimura, Yokohama (JP);
Yoshimi Hisatsune, Kawasaki (JP);
Nobuo Hayasaka, Yokosuka (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/646,703

(22) Filed: Aug. 25, 2003

(65) Prior Publication Data
US 2004/0043596 A1    Mar. 4, 2004

Related U.S. Application Data

(62) Division of application No. 09/722,467, filed on Nov. 28, 2000, now Pat. No. 6,657,306, which is a division of application No. 09/321,534, filed on May 28, 1999, now Pat. No. 6,235,624.

(30) Foreign Application Priority Data

| Jun. 1, 1998 | (JP) | ................................. 10-151800 |
| Sep. 11, 1998 | (JP) | ................................. 10-258830 |

(51) Int. Cl.
*H01L 21/4763* (2006.01)
*H01L 21/44* (2006.01)

(52) U.S. Cl. ...................... 438/637; 438/640; 438/675; 438/977

(58) Field of Classification Search ............... 438/637, 438/640, 675, 928, 977
See application file for complete search history.

(56) References Cited

U.S. PATENT DOCUMENTS

| 4,840,923 A | | 6/1989 | Flagello et al. ................ 216/19 |
| 5,292,624 A | * | 3/1994 | Wei ............................ 430/313 |
| 5,842,106 A | * | 11/1998 | Thaler et al. .................. 419/8 |
| 5,913,146 A | | 6/1999 | Merchant et al. ........... 438/646 |
| 6,057,231 A | | 5/2000 | Givens et al. .............. 438/644 |
| 6,077,782 A | | 6/2000 | Hsu et al. .................... 438/698 |
| 6,194,024 B1 | | 2/2001 | Arldt et al. ................ 427/97.2 |

FOREIGN PATENT DOCUMENTS

| JP | 404058589 A | 2/1992 |
| JP | 04-291789 A | 10/1992 |
| JP | 5-242723 | 9/1993 |
| JP | 6-215915 | 8/1994 |

(Continued)

OTHER PUBLICATIONS

Japanese Office Action dated Jul. 10, 2003, and English translation thereof.

(Continued)

*Primary Examiner*—William M. Brewster
(74) *Attorney, Agent, or Firm*—Finnegan, Henderson, Farabow, Garrett & Dunner, L.L.P.

(57) ABSTRACT

Form a trench in a major surface of a semiconductor substrate, then bury a paste in the trench. The paste contains solids having a conductive substance and a resin, and solvent for dissolving the resin. The solids content of the paste is not less than 60 vol % and a viscosity ratio thereof is not more than 2.

5 Claims, 7 Drawing Sheets

FOREIGN PATENT DOCUMENTS

| | | |
|---|---|---|
| JP | 8-17671 | 1/1996 |
| JP | 9-219577 | 8/1997 |
| JP | 10-56060 | 2/1998 |
| JP | 10-223833 | 8/1998 |

OTHER PUBLICATIONS

Japanese Patent Office Action dated Nov. 4, 2003, and English translation thereof.

* cited by examiner

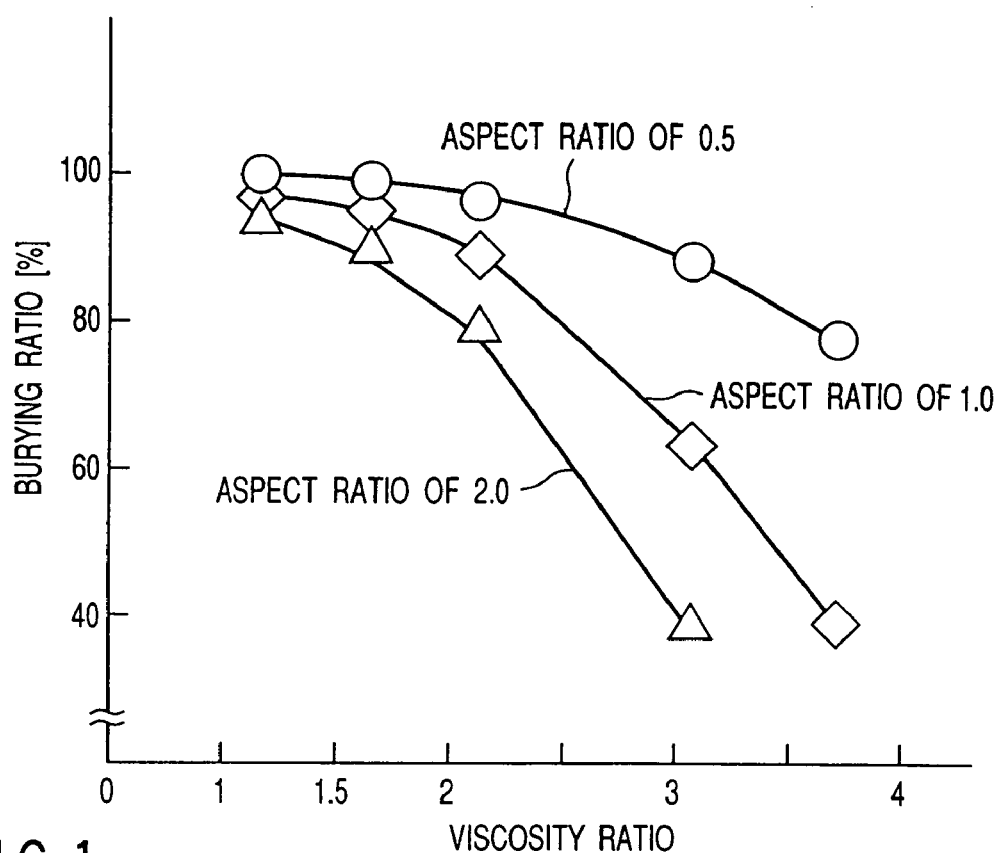
F I G. 1
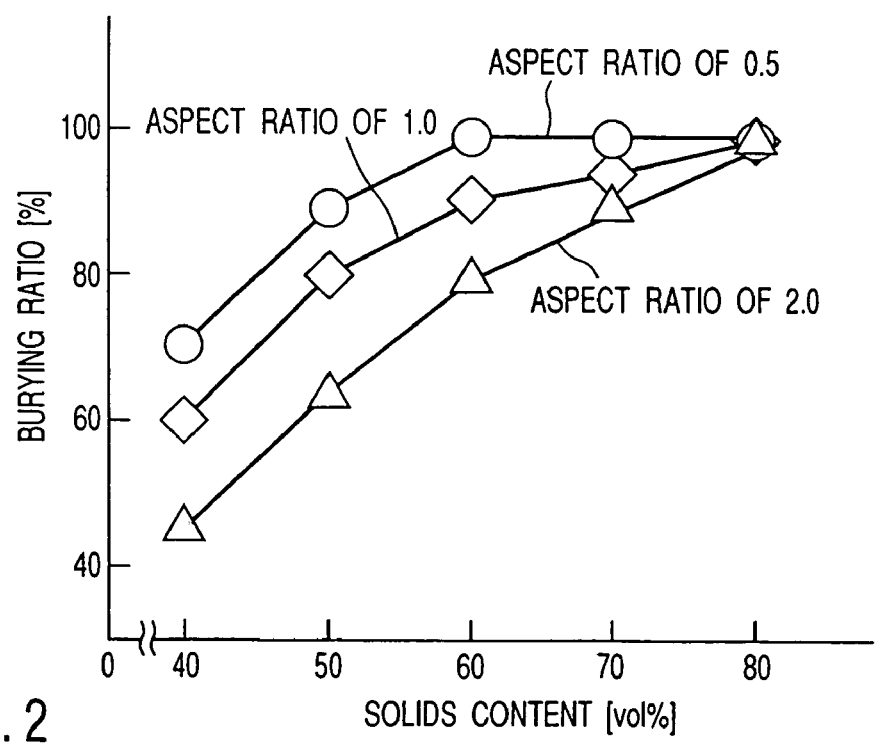
F I G. 2

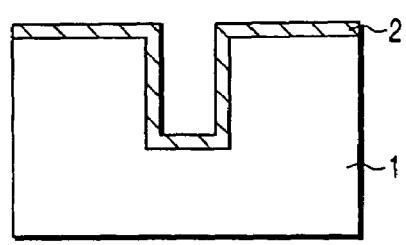
F I G. 4A
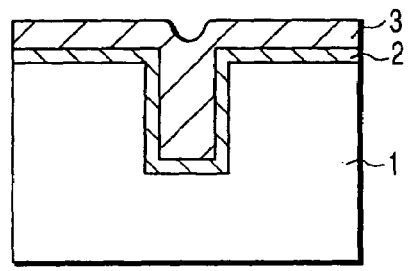
F I G. 4B
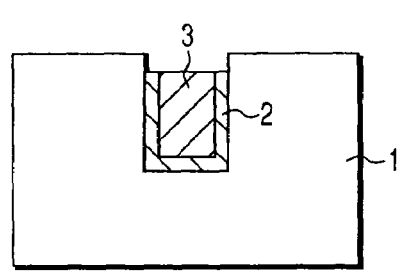
F I G. 4C
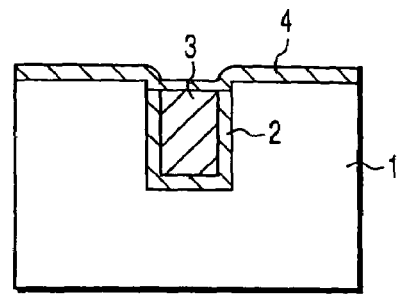
F I G. 4D
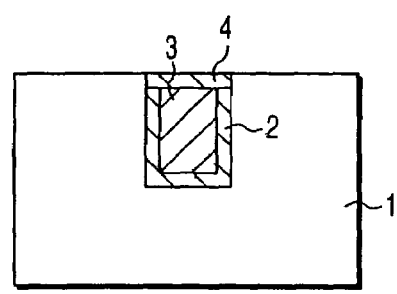
F I G. 4E
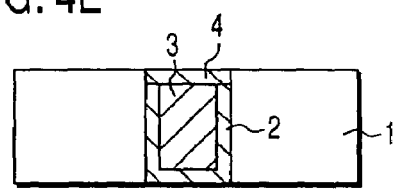
F I G. 4F
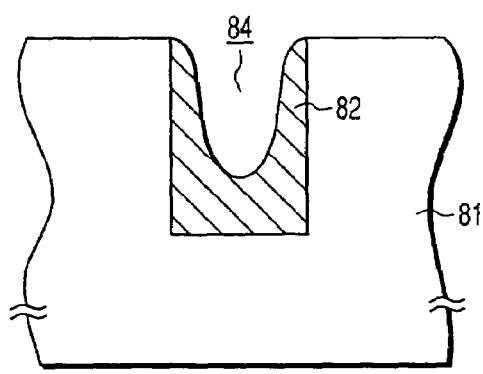
F I G. 5A
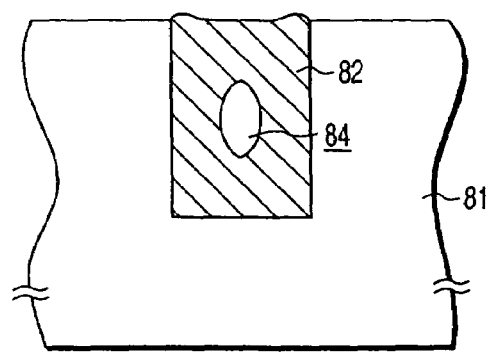
F I G. 5B

PASTE INCLUDING A MIXTURE OF POWDERS, CONNECTION PLUG, BURYING METHOD, AND SEMICONDUCTOR DEVICE MANUFACTURING METHOD

This is a divisional of application Ser. No. 09/722,467, filed Nov. 28, 2000, now U.S. Pat. No. 6,657,306, which is a divisional of application Ser. No. 09/321,534, filed May 28, 1999, now U.S. Pat. No. 6,235,624, and claims the benefit of Japanese Application no. 10-258830, filed Sep. 11, 1998, all of which are incorporated herein by reference.

BACKGROUND OF THE INVENTION

To improve the performance and, particularly, speed of an electronic circuit system constituted by a plurality of semiconductor chips, it has become increasingly important to reduce the length of the interconnections between the semiconductor chips to a minimum.

For this purpose, a technique of minimizing the interconnections between a plurality of semiconductor chips by stacking them has been studied instead of the conventional method of mounting a plurality of semiconductor chips two-dimensionally on a multilayer board. Such a semiconductor device formed by stacking a plurality of semiconductor chips is called a multichip module.

In addition, with the use of a multichip module of this type, different types of semiconductor chips manufactured by different processes can be stacked on each other into one hybrid semiconductor device.

To manufacture a multichip module, vertically stacked semiconductor chips must be electrically connected. For the realization of such connection, the present inventors have already proposed the use of connection plugs (chip-through plugs) that extend through vertically stacked semiconductor chips to connect them (Japanese Patent Application No. 9-305784).

BRIEF SUMMARY OF THE INVENTION

A paste according to the present invention is characterized by containing solids having a conductive substance and a resin, and a solvent for dissolving the resin, wherein a solids content is not less than 60 vol %.

In the present invention, the solids content indicates the ratio of solids (e.g., metals, glass, and resins) in a paste, which are left on a substrate upon hardening the paste to the total paste (solids+solvent). In the following description, this ratio indicates the volume ratio unless otherwise specified.

In the present invention, the solids content of a paste is set to 60 vol % or more for the following reason. When a paste is hardened (dried) after it is buried in a trench with a squeegee, the solvent in the paste volatilizes.

Upon this volatilization of the solvent, the volume of the paste reduces. If the volume reduction of the paste is large, the trench cannot be filled with the paste. A deterioration in buried shape due to such a volume reduction can be effectively prevented by increasing the solids content of the paste.

When the solids content is set to 60 vol % or more as in the present invention, in particular, occurrence of a volume reduction that causes connection failures and the like can be effectively prevented, and the trench can be filled with the paste with a good buried shape.

In addition, another paste according to the present invention is characterized by containing solids having a conductive substance and a resin, and a solvent for dissolving the resin, wherein a viscosity ratio is not more than 2.

In the present invention, the viscosity ratio of a paste indicates the ratio of viscosity changes in a case wherein the viscosity of the paste is measured with a rotational viscometer at rotational speeds that differ by one order of magnitude.

Assume that the viscosity of a given paste is measured with the rotational viscometer at different rotational speeds, and viscosities of 200 Pa·s and 100 Pa·s are respectively measured at 10 rpm and 100 rpm. In this case, the viscosity ratio is 200 Pa·s/100 Pa·s=2. The burying ratio of a viahole is the ratio of the paste to the sectional area of the viahole when the cross-section of the viahole is observed after a paste burial test.

In the present invention, the viscosity ratio of a paste is set to 2 or less for the following reason. When the viscosity ratio is high, the viscosity of the paste receiving force from the squeegee becomes low. When the paste receives no force, the viscosity increases. For this reason, when the paste is buried in a trench with the squeegee, the viscosity of the paste becomes high at the bottom portion of the trench. This makes it difficult to bury the paste.

If, however, the viscosity ratio is set to 2 or less as in the present invention, an increase in the viscosity of the paste at the bottom portion of the trench can be effectively suppressed. This prevents formation of voids that cause a connection failure and an increase in resistance. Hence, the trench can be filled with the paste.

Furthermore, still another paste according to the present invention is characterized by containing solids having a conductive substance and a resin, and a solvent for dissolving the resin, wherein a solids content is not less than 60 vol % and a viscosity ratio is not more than 2.

The trench can be filled with this paste with a good buried shape.

In consideration of the buried shape, the viscosity of the above paste is preferably 200 pas or less. In addition, if the paste is to be used for a connection plug, the main component of the paste should be a conductive substance.

A connection plug according to the present invention is a connection plug made of a paste containing powder particles having different average sizes and buried in a connection hole. This connection plug is characterized in that the paste contains 10% or more of a powder having an average particle size of 3 μm or more.

In this case, the paste preferably contains 10% or more of a powder having an average particle size of 1 μm or more. The powder may be the main component of the paste or another component. For example, the connection hole is a through hole extending through a semiconductor chip.

The viscosity of the paste is determined by the total surface area of powder particles in the resin contained in the paste. As the total surface area increases, the viscosity decreases. With the use of a connection plug containing a powder of a large average particle size as in the present invention, therefore, the paste as the connection plug can be buried in a trench with a good buried shape. In addition, according to the study conducted by the present inventors, it was found that the occurrence rate of cracks could be reduced sufficiently by setting the content of such a powder to 10% or more.

A burying method according to the present invention is characterized in that a paste according to the present invention is buried in a trench formed in the surface of a substrate.

With this arrangement, a good buried shape can be realized even by a burying method using a squeegee.

In addition, the burying method according to the present invention is characterized in that a powder dispersion is applied on a region including a trench formed in the surface of a substrate, and the powder is precipitated in the solution, thereby filling the trench with the powder.

According to this arrangement, since the trench is filled with the small-volume powder that precipitates, a deterioration in buried shape, e.g., formation of a void, is suppressed.

In this case, as the above dispersion, a solution to which a resin is added is preferably used. With the use of such a solution, the powder particles can be temporarily fixed with the resin.

In addition, the powder preferably partially contains glass. With the use of this powder, the glass melts in a calcination process to fill the trench without any recess.

A method of manufacturing a semiconductor device according to the present invention is characterized by comprising the steps of forming a trench in a surface of a substrate, filling the trench with a calcination type paste formed inside and outside the trench, temporarily hardening the paste, removing an excess portion of the paste outside the trench, and calcining the paste.

In the present invention, the excess portion of the paste is removed in the step of temporarily hardening the paste, in which the paste can be easily removed, instead of the step after calcination in which the paste is difficult to remove. Even if, therefore, the width of the trench increases, and the amount of paste increases, an excess paste portion can be removed without taking much time.

According to the present invention, therefore, even if the width of the trench is increased to decrease the resistance of the connection plug, an increase in the formation time of a connection plug made of a paste can be suppressed.

Preferred aspects or more detailed forms of the semiconductor device manufacturing method according to the present invention will be described below.

(1) The excess portion of the paste outside the trench is removed by polishing or etching. The above polishing is preferably CMP (Chemical Mechanical Polishing). The above etching is RIE (Reactive Ion Etching) or CDE (Chemical Dry Etching).

(2) After the paste is calcined, the lower surface of the substrate is removed until the paste appears, thereby forming a connection plug made of the paste penetrating the substrate. More specifically, the lower surface is removed by polishing or etching. The above polishing is preferably CMP. The above etching is RIE or CDE.

In cases (1) and (2), after the trench is filled with the paste to a certain degree, different pressures are applied to portions inside and outside the trench, thereby filing an unfilled region in the trench with the paste. Even if the depth of the trench increases, the overall trench can be filled with the paste. In these cases, therefore, even if the depth of the trench is increased to decrease the resistance of a connection plug, a connection plug made of a paste without any void can be formed.

(3) After the step of calcining the paste, an interconnection is formed on the paste.

(4) This method is characterized by using a conductive paste (plug body) as the above paste.

In cases (3) and (4), an insulating film is formed in advance between the surface of the trench and the conductive paste. If, however, an insulating substrate such as a ceramic substrate is used as the above substrate, such an insulating film is not required. Furthermore, if an insulating paste is used as the above paste, a conductive film (connection plug body) is formed in advance on the surface of the trench.

In addition, another semiconductor device manufacturing method according to the present invention is characterized by comprising the steps of forming a trench in a major surface of a substrate, burying a calcination type paste in the trench so as to fill a space including at least a portion on a bottom surface of the trench, filling an unfilled region in the trench with the paste by making a pressure on the paste outside the trench higher than a pressure on the unfilled region in the trench filled with the paste, and removing an excess portion of the paste outside the trench.

Furthermore, still another semiconductor device manufacturing method according to the present invention is characterized by comprising the steps forming a trench in a major surface of a substrate, burying a calcination type paste in the trench so as to leave a space including at least a portion of a bottom surface of the trench, filling an unfilled region in the trench with the paste by making a pressure on the paste outside the trench higher than a pressure on the unfilled region in the trench filled with the paste, temporarily hardening the paste, removing an excess portion of the paste outside the trench, and calcining the paste.

According to the present invention, even if the width and depth of a trench are increased to sufficiently decrease the resistance of a connection plug, an increase in the formation time of a paste can be suppressed, and a connection plug made of a paste without any void can be formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a graph showing the relationship between the viscosity ratio of a paste and the burying ratio of a viahole;

FIG. 2 is a graph showing the relationship between the solids content of a paste and the burying ratio;

FIGS. 4A to 4F are sectional views showing the steps in a method of forming a chip-through plug according to the second embodiment of the present invention;

FIGS. 5A and 5B are sectional views for explaining problems posed in a conventional method of burying a paste in a trench (screen printing);

DETAILED DESCRIPTION OF THE INVENTION

Figure 3:
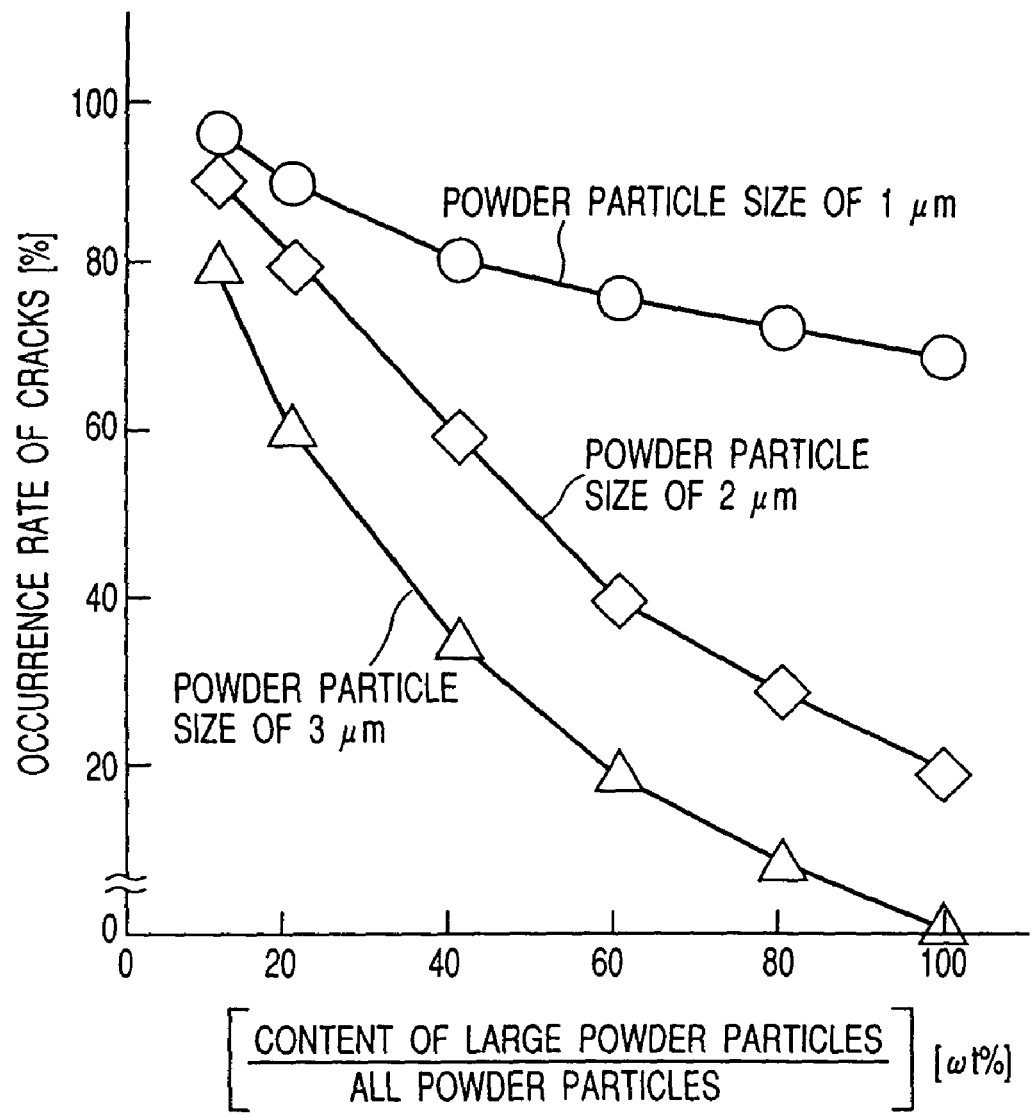
FIG. 3 is a graph showing the relationship between the average particle size of large powder particles, the occurrence rate of cracks in the paste, and the content of large powder particles.

Embodiments of the present invention will be described below with reference to the accompanying drawings.

The present inventors examined the conventional method of forming a chip-through plug (Japanese Patent Application No. 9-305784) and found the following problem.

When the above chip-through plug is to be formed, a conductive paste as a chip-through plug is buried in a trench (opening diameter: 50 to 100 μm; depth: 100 to 150 μm) formed in the surface of an Si substrate. The lower surface of the Si substrate is then polished until the paste appears.

As a method of burying the paste, a burying method (screen printing) using a squeegee is used because of its simplicity and easiness.

In the method using the squeegee, however, the trench formed in the surface of a substrate 81 cannot be sufficiently filled with a paste 82. As a result, a recess 83 or a void 84 is formed.

Such a deterioration in the buried shape of the paste 82 causes a connection failure or an increase in resistance. This problem become noticeable not only when the width of the trench is increased to sufficiently decrease the resistance of the chip-through plug but also when the depth of the trench is increased.

Embodiments of the present invention which can prevent the above deterioration in buried shape will be described below.

(First Embodiment)

In this embodiment, a paste is buried in a trench formed in the surface of a substrate by a printing method using a squeegee. In the conventional method, as shown in FIGS. 5A and 5B, voids and recesses were formed in trenches because a paste is not sufficiently buried in the trenches.

The present inventors found that the causes of this problem were a change in the viscosity of the paste when buried with the squeegee and the shrinkage of the paste upon volatilization (to be referred to as hardening hereinafter) of the solvent of the paste. To improve the buried shape of a paste, this embodiment therefore uses a paste for which a viscosity change upon burial and a solids content are controlled.

FIG. 1 shows the relationship between the viscosity ratio of a paste and the burying ratio of a viahole. In this case, the viahole has a depth of 50 to 200 μm and an opening diameter of 100 μm. The paste was buried under the condition that the viscosity measured by a rotational viscometer became 150 Pa·s when the rotational speed was 200 rpm. The average diameter of the paste was set to 1 μm. The viscosity ratio was controlled with the resin component of the paste, and the solids content was set to 60 vol %.

As shown in FIG. 1, when the viscosity ratio is 3, the viahole having an aspect ratio of 0.5 (depth of 50 μm) exhibits a burying ratio of 90%, but the viahole having an aspect ratio of 2 (depth of 200 μm) exhibits a burying ratio of 40%.

It was found that viscosity ratios of 3 or less, 2 or less, and 1.5 or less needed to be respectively set for the viaholes having aspect ratios of 0.5 (depth of 50 μm), 1 (depth of 50 μm), and 2 (depth of 200 μm) to ensure a burying ratio of 90% or more.

Although the relationship between the burying ratio and the viscosity ratio was obtained with the opening ratio ranging from 40 to 200 μm and the depth ranging from 20 to 400 μm, it was found from the research conducted by the present inventors that when the viscosity ratio was constant, the burying ratio was determined by only the aspect ratio regardless of the depth.

The mechanism of increasing the burying ratio by keeping the viscosity ratio constant can be explained by the load imposed by the squeegee in burying the paste. When the viscosity ratio of the paste is high, the viscosity of the paste decreases in the presence of a force from the squeegee, but increases in the absence of a force. For this reason, the viscosity becomes high at a bottom portion of a trench at which the load from the squeegee is light, hindering the paste from being buried.

As is obvious from the above description, the burying ratio can be effectively increased by decreasing the viscosity ratio, and a burying ratio of 90% or more can be obtained even at an aspect ratio of 1 by setting the viscosity ratio to 2 or less.

FIG. 2 shows the relationship between the solids content of the paste and the burying ratio. In this case, the paste was buried in a trench by directly scanning the squeegee on the substrate without using any mask. The viscosity ratio of the paste was 1.5. The paste was buried under the condition that the viscosity measured by the rotational viscometer became 150 Pa·s when the rotational speed was 20 rpm.

As shown in FIG. 2, as the solids content increases, the burying ratio increases. When the aspect ratio is 1, a burying ratio of 90% or more can be obtained with a solids content of 60 vol % or more, and a burying ratio of 95% or more can be obtained with a solids content of 70 vol % or more.

As is obvious from FIG. 2, when the aspect ratio is 0.5 or more, a burying ratio of 90% or more can be obtained with a solids content of 65% or more, and a burying ratio of 100% or more can be obtained with a solids content of 80% or more.

The relationship between the solids content of the paste and the burying ratio can be explained as follows. When the paste is hardened after it is buried in a trench with the squeegee, the solvent in the paste volatilizes. As a result, the volume of the paste reduces by the amount of volatilized solvent. If this volume reduction is large, the trench cannot be filled with the paste, resulting in a great decrease in burying ratio.

As is obvious from the above description, the burying ratio can be effectively increased by increasing the solids content, and a burying ratio of 90% or more can be obtained even at an aspect ratio of 1 by setting the solids content to 60 vol % or more.

As described above, the burying ratio can be effectively increased by decreasing the viscosity ratio (preferably to 2 or less) or increasing the solids content (preferably to 60 vol % or more). More preferably, the viscosity ratio is decreased and the solids content is increased at the same time.

In this embodiment, the viscosity of the paste was 150 Pa·s. However, a high burying ratio could be realized between 100 to 200 Pa·s as in the embodiment.

To increase the solids content of the paste without increasing the viscosity of the paste to a high value, i.e., a value exceeding 200 Pa·s, the density of the solids may be decreased. For example, the amount of resin in the paste may be increased, the glass component may be increased in amount, or a low-density light metal may be used as a metal material.

Alternatively, the average particle size of the powder in the paste may be increased. As the average particle size of the powder increases, the surface area of the powder per unit volume increases. As the surface area per unit volume increases, the viscosity increases under the influence of the surface tension. This increases the solids content while maintaining the viscosity. Note that the powder may be the main component of the paste or another component.

Although different values were obtained-in the paste viscosity range of 50 to 400 Pa·s, similar tendencies were found in this range. When, for example, the viscosity of the paste was 200 to 400 Pa·s, and the solids content was 60 vol %, the viscosity ratio needed to be 1.5 or less to realize a burying ratio of 90% in a trench having an aspect ratio of 1. This viscosity ratio was lower than that in the embodiment (viscosity of 150 Pa·s). Furthermore, a burying ratio of 90% or more could be realized at a viscosity ratio of 3 or less.

In addition, a high burying ratio can be realized even by using a metal, a glass material, a mixture, or a composite material as a paste material.

In this case, to decrease the viscosity of the paste, the particle size of the paste is preferably increased or the particle size distribution of the paste is preferably made broad. The particle size distribution of the paste may be made broad by using a method of mixing powder particles with different average sizes. When the particle size distribution is made broad, the viscosity decreases to improve the buried shape and suppress occurrence of cracks upon hardening.

When, for example, powder particles having average sizes of 1 μm and 5 μm are mixed in an Ni paste, the occurrence rate of cracks in the paste-becomes ½ or less that in an Ni paste obtained by mixing only a powder having an average particle size of 1 μm. Note that the powder may be made of Ni or another material.

FIG. 3 shows the relationship between the average size of large powder particles, the occurrence rate of cracks in the paste, and the content of large powder particles (large powder particles/all powder particles [wt %]) when powder particles containing large powder particles having a size of 1 μm or more are mixed in the paste. In this case, the average particle size of the paste is 1 μm, and the average sizes of the large powder particles are 1 μm, 2 μm, and 3 μm, respectively.

As is obvious from FIG. 3, when the large powder particles having an average size of 3 μm are used, the occurrence rate of cracks in the paste can be suppressed to 80% by setting the content of the large powder particles to 10% or more, and the occurrence rate of cracks can be suppressed to about 20% or less by setting the content to 60% or more.

In practicing the present invention, in consideration of its mechanism, the resin and solvent in the paste need not be specified. Even if, for example, ethyl cellulose, terpineol, or acrylic resin is used as a resin, the paste can be buried in the same manner as in this embodiment as long as the above conditions for viscosity ratios and solids contents are satisfied.

When a metal paste is used, the amount of resin is preferably small in consideration of a decrease in resistance. When a paste was to be finally formed in only a trench, in particular, only a minimum amount of resin was required for temporary holding, and 3% or more of the total paste was sufficient for the amount of resin for temporary holding.

In addition, if the amount of resin is 6 wt % or more, since the solvent and solids in the paste do not separate from each other, long-term storage is facilitated. If, therefore, a paste is to be simply formed, the amount of resin is preferably 6 wt % or more.

If the wettability between a paste and a substrate was poor in a burying process, the buried shape deteriorated. When the viscosity of the paste was 50 Pa·s or less, in particular, the buried shape was improved by improving the wettability between the paste and the substrate. For example, the wettability can be improved by performing ultrasonic cleaning of the substrate with the solvent in the paste, cleaning the substrate with a surfactant, or using a surfactant-containing paste.

(Second Embodiment)

In this embodiment, a chip-through plug (connection plug) for a multichip module is formed by using a paste having excellent burying characteristics as in the first embodiment.

The following conditions are required for a chip-through plug. The chip-through plug must be sufficiently buried in a trench to allow the chip to make lower-surface contact. The upper portion of the chip-through plug (to be referred to as the plug upper portion hereinafter) must be flat to allow an interconnection to be formed on the plug upper portion. The lower portion of the chip-through plug (to be referred to as the plug lower portion hereafter) must have wettability with respect to a repairable material such as a solder and be dense not to absorb a solder or the like.

As a method of satisfying such requirements, a method of improving the buried shape, planarization, and denseness of a chip-through plug by forming sputtered films on both the plug upper portion and the plug lower portion is available. In this embodiment, however, a method of improving these properties by a paste itself. According to this method, a chip-through plug can be formed by using only a paste. Since the step of forming sputtered films is not required, the process is simplified.

FIGS. 4A to 4F are sectional views showing the steps in a method of forming a chip-through plug according to this embodiment. First of all, as shown in FIG. 4A, a trench is formed in the upper surface of an Si substrate 1, and a paste containing materials such as Ni, Cu, and Au exhibiting good wettability with respect to a solder and having a small particle size distribution (to be referred to as a fine paste hereinafter) 2 is deposited on the entire surface of the trench to cover the bottom and side surfaces of the trench. At this time, the trench is not filled with the fine paste 2.

As shown in FIG. 4B, the trench is filled with a paste having a large particle size distribution and exhibiting a high burying ratio (to be referred to as a buried paste hereinafter) 3 like the one described in the first embodiment by a burying method using a squeegee.

As shown in FIG. 4C, that excess portion of the buried paste 3 outside the trench and the buried paste 3 slightly below the opening surface of the trench are removed by polishing or etching. As a result, an unfilled portion is formed in the upper portion of the trench. Thereafter, the fine paste 2 and the buried paste 3 are calcined.

As shown in FIG. 4D, a fine paste 4 is deposited on the entire surface of the resultant structure to fill the unfilled portion.

As shown in FIG. 4E, the excess portion of the fine paste 4 outside the trench is removed by CMP to planarize the upper surface, and the fine paste 4 is calcined. Note that the fine paste 2 and the buried paste 3 may not be calcined in the step in FIG. 4C, but all the paste 2 to paste 4 may be calcined altogether in the step in FIG. 4E.

Finally, as shown in FIG. 4F, the lower surface of the Si substrate 1 is polished to expose the fine paste 4, thus completing the chip having the chip-through plug made up of the fine paste 2, the buried paste 3, and the fine paste 4 and extending through the Si substrate 1.

Note that the use of an appropriate slurry in the step in FIG. 4C will obviate the necessity of the fine paste 4 for planarizing the plug upper portion. More specifically, this step may use a slurry that can remove the main component of a paste (for example, Ni if an Ni paste is used) by CMP in which the contribution of chemical polishing is larger than that of mechanical polishing.

The use of such a slurry can prevent the paste 3 and paste 4 from being physically polished to an excessively low level by mechanical polishing even if the upper portions of the paste 3 and paste 4 contain large particles of the main components. Therefore, the upper surface can be planarized.

(Third Embodiment)

As a method of burying a filling member having conductivity such as a chip-through plug in a trench, a method of dispersing a conductive powder with a solvent in advance, applying this powder (powder+solvent) on the substrate in which the trench is formed, and precipitating the powder in the solvent, thereby burying the powder in the trench is available in addition to the method of burying a paste with a squeegee.

For example, an Ni powder having an average particle size of 1 µm is dispersed in a methanol solution, and the solution is applied to a substrate in which a plug is formed. Since the dispersed NI powder precipitates, the Ni powder is deposited on the substrate. The substrate is then dried to evaporate the methanol. Thereafter, the Ni powder is calcined. As a consequence, the powder is completely buried in the trench (this method will be referred to as the precipitation method hereinafter). After this process, the Ni powder portion calcined outside the trench is removed, as needed.

In burying the powder in the trench by the precipitation method, since the binding force between the particles of the powder in the trench is lost upon volatilization of the solvent, a resin is preferably dissolved in the solvent to allow the powder particles to precipitate and combine with each other upon precipitation of the powder or volatilization of the solvent.

As methods of fixing the powder, a method of sealing the powder with a resin upon volatilization of the solvent and a method of forming a film on the opening surface of the trench are available. In the latter method, since no resin is contained in the powder, the powder can be calcined without being influenced by the atmosphere in calcination.

Although the method of fixing the powder has been described above, if no vibration is applied to the stage, the powder need not be fixed.

In addition, a chip-through plug for the multichip module of the second embodiment can also be formed by using the precipitation method of this embodiment.

More specifically, a powder of a small particle size (fine powder) is precipitated first, and then a powder of a large particle size (buried powder) is precipitated. The buried powder outside the trench and the buried powder and fine powder slightly below the opening surface of the trench are removed. Finally, a fine powder precipitates on an unfilled portion of the trench. These powder portions may be calcined collectively or separately.

Alternatively, the precipitation method may be performed by using a powder obtained by mixing large powder particles and small powder particles. In this case, the stepped portion on the upper portion can be improved by performing control such that the large powder particles precipitate first, and the small powder particles are deposited thereon.

In the precipitation method described above, wettability between the substrate and the solvent used for the method is important. If a solvent of poor wettability must be used as a dispersant for the powder, a method of physically improving the quality of the powder by using ultrasonic waves or a method of improving the quality of the solvent by using a surfactant must be used together. When, however, the viscosity was about 20 to 50 Pa·s, i.e., the viscosity was relatively high, wettability did not have much influence.

In addition, to shorten the precipitation time of the powder, a coagulant that weakens the effect of the dispersant may be added or precipitation may be speeded up by using centrifugal force.

(Fourth Embodiment)

In the burying method of a paste using a squeegee (screen printing), the particle size of the paste, particle size distribution, and particle shape influence paste burial.

The particles of a paste used for a chip-through plug are preferably fine particles in order to planarize the plug upper portion.

When a paste is to be buried by screen printing, the average size of the particles of the paste is preferably 0.5 µm or more and 5 µm or less. In addition, particles having an average size of 1 µm or less are preferably 10% or more, and particles having an average size of 3 µm or more are preferably 10% or more.

When particles having an average size of 1 µm are to be exposed on the plug upper portion, the above particles must be removed by CMP. The particles serve as the main component of the paste and other components.

As a particle shape, a shape with a large particle area, e.g., a confetto-like shape, is effective in increasing the viscosity. In addition, owing to many projections of this shape, conduction improves in calcination, resulting in a decrease in resistance.

The particle size distribution in screen printing is important. If large particles are required to control the particle size distribution, the use of a glass material as such material, which dissolves in calcination, can improve the buried shape and planarization.

If the main component of a paste is Au, it is difficult to increase the solids content by using only Au because of high density. For this reason, coating particles containing Ni as a nucleus with Au can improve the buried shape while taking advantage of the characteristics of the high-density material. In addition, if no specific problem arises in a burying process, the buried shape can be improved by intentionally adding a low-density material.

The present inventors examined the conventional chip-through plug forming method (Japanese Patent Application No. 9-305784) and further found the following problems.

As a method of burying the above conductive paste, a burying method using a squeegee (screen printing) is used because of its simplicity and easiness.

In the burying method using a mask and a squeegee, a conductive paste portion remains on an Si substrate by the amount corresponding to the thickness of the mask, although it depends on the method to be used.

In a case of a connection plug connected to a power supply line, in particular, as the width of a trench increases because of requirements for a decrease in the resistance of the connection plug, a thicker conductive paste must be applied on an Si substrate. As a consequence, a thicker paste portion remains on the substrate.

In the method of burying a conductive paste by directly applying it on an Si substrate with a squeegee without using any mask, an excess conductive paste portion protruding from the squeegee remains on the Si substrate.

When the excess conductive paste portion is removed after the conductive paste is calcined, the thickness of the excess conductive paste portion becomes as large as several tens μm in either of the above methods.

It takes much time to remove such a thick excess conductive paste portion by CMP, resulting in an increase in the time required to form a connection plug. This decreases the productivity of multichip modules.

To further decrease the resistance of a connection plug, both the width and depth of a trench are increased. In the burying method using the squeegee, as a trench becomes thicker (aspect ratio increases), the trench cannot be sufficiently filled with a paste. As a result, a chip-through plug having a void is formed.

An embodiment of the present invention which can solve the above problems that arise when the size (width and depth) of a trench is increased will be described below.

(Fifth Embodiment)

FIGS. 6A to 6E are sectional views showing the steps in a method of forming a chip-through plug according to the fifth embodiment of the present invention. In this embodiment, a chip-through plug is formed in a ceramic substrate.

Figure 6A:
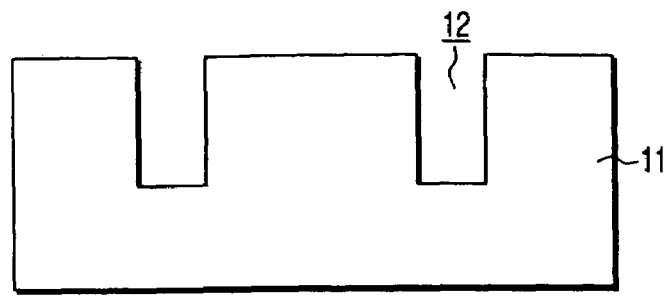
FIGS. 6A to 6E are sectional views showing the steps in a method of forming a connection plug according to the fifth embodiment of the present invention.

First of all, as shown in FIG. 6A, a trench 12 having, for example, an opening diameter of 100 μm and a depth of 200 μm is formed in the surface of a ceramic substrate 11 having, for example, a width of 4 cm and a thickness of 0.8 mm. Thereafter, the ceramic substrate 11 is calcined.

Figure 6B:
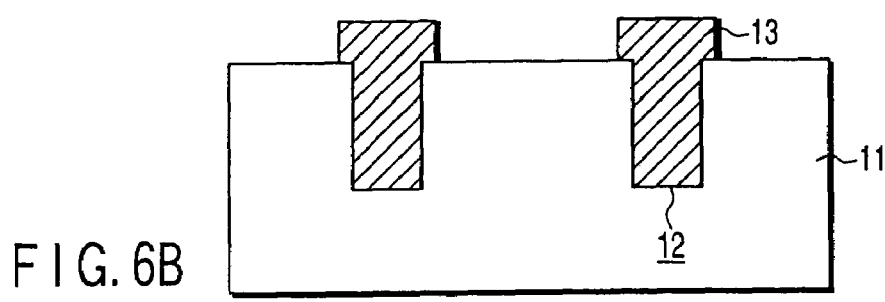

As shown in FIG. 6B, a calcined conductive paste 13 having a thickness larger than the depth of the trench 12 is buried in the trench 12 by the burying method (screen printing) using the squeegee and a metal mask having an opening portion equal to or larger than the opening diameter of the trench 12, e.g., a metal mask having an opening diameter of 120 μm and a thickness of 30 μm. At this time, the excess portion of the conductive paste 13 which protrudes from the squeegee remains on the substrate (on the trench 12 and its peripheral portion). The conductive paste 13 having a thickness smaller than the depth of the trench 12 may be buried in the trench 12 as long as the trench 12 can be entirely filled with the paste finally.

Figure 6C:
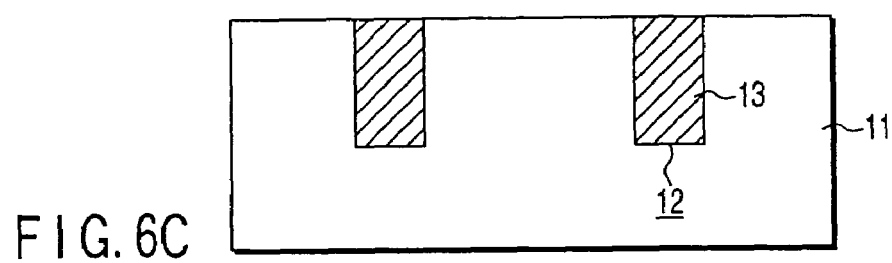
Figure 6D:
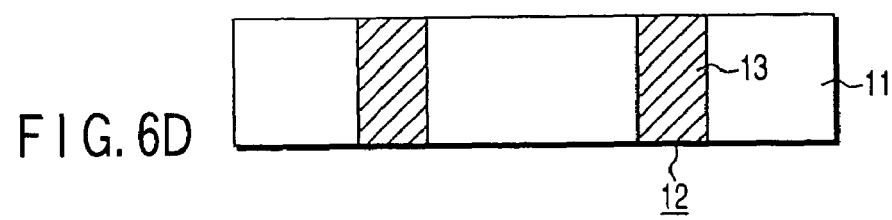

After the conductive paste 13 is temporarily hardened by a heat treatment at 140° C. for 10 min, the excess portion of the conductive paste 13 outside the trench 12 is removed by CMP or mechanical polishing (MP) using a grindstone, as shown in FIG. 6C.

At this time, since the conductive paste 13 is only temporarily hardened, the excess portion of the conductive paste 13 outside the trench 12 can be removed by polishing with a weak force enough to destroy the resin in the conductive paste 13.

As a result, the excess portion of the conductive paste 13 can be removed at a rate as high as 20 to 100 μm/min as compared with a low rate of 1 μm/min in the conventional method. In this embodiment, therefore, the excess portion of the conductive paste 13 can be removed in a very short period of time as compared with the prior art.

The conductive paste 13 is then calcined at 500° C. to remove the resin component in the conductive paste 13 and ensure conductivity of the conductive paste 13. The conductive paste 13 in this step will be referred to as the chip-through plug 13 hereinafter.

Figure 7A:
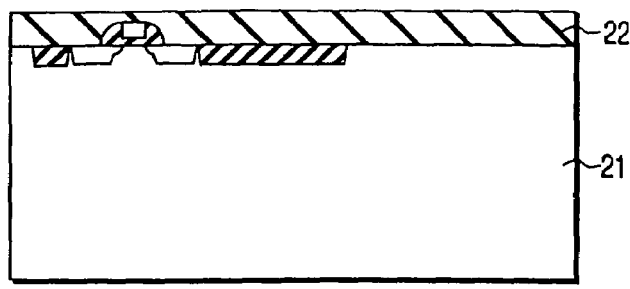
FIGS. 7A to 7G are sectional views showing the steps in a method of forming a connection plug according to the sixth embodiment of the present invention.
Figure 7B:
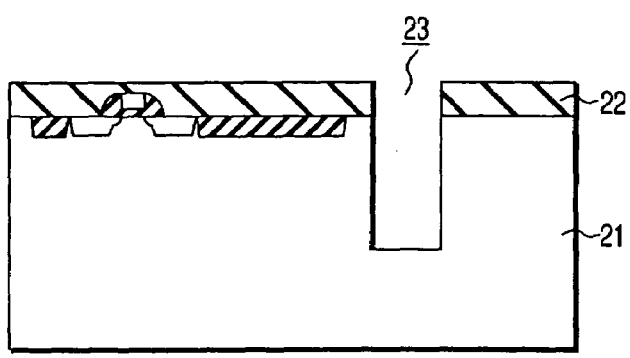
Figure 7C:
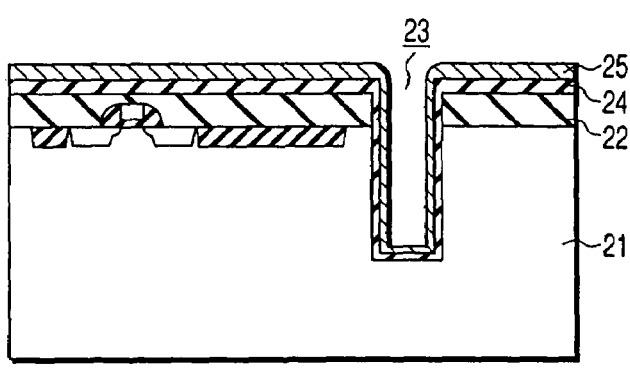
Figure 7D:
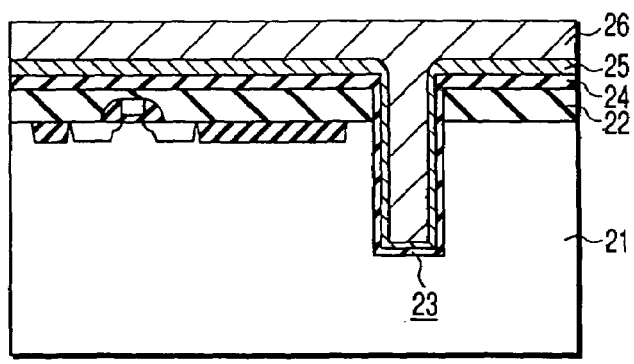

Finally, as shown in FIG. 7D, the lower surface of the ceramic substrate 11 is polished until the chip-through plug 13 appears, thereby completing the chip-through plug 13 extending through the ceramic substrate 11. The above polishing is, for example, CMP or MP. In addition, the lower surface may be removed by etching such as RIE or CDE instead of polishing.

Figure 6E:
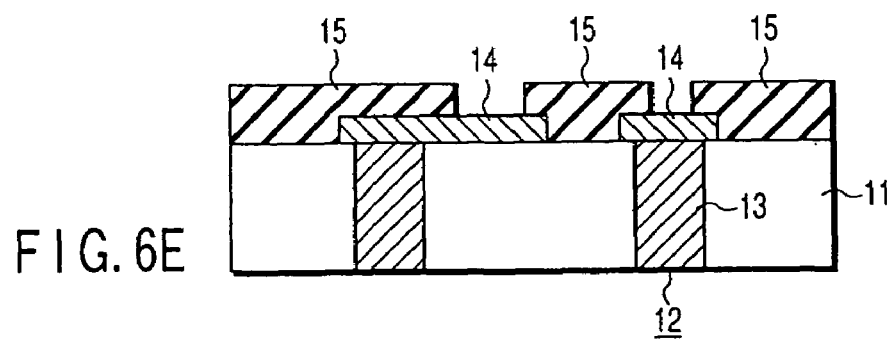

The subsequent steps are the same as those for a general multichip module. For example, as shown in FIG. 6E, the subsequent steps are the step of forming an interconnection 14 connected to the chip-through plug 13 on the ceramic substrate 11 and the step of forming an interlevel insulating film 15 on the entire surface of the resultant structure and forming a connection hole facing the interconnection 14.

As described above, according to this embodiment, the excess portion of the conductive paste 13 is removed in the step of temporarily hardening the paste, in which the paste can be easily removed, instead of the step after calcination in which the paste is difficult to remove. For this reason, even if the trench 12 having a large opening diameter is formed to decrease the resistance of the chip-through plug, the excess portion of the conductive paste 13 can be removed in a short period of time.

In addition, in this embodiment, since the conductive paste 13 is buried in the trench 12 after calcination of the ceramic substrate 11 (after high-temperature heat treatment), a metal paste having a relatively low resistance, e.g., Ni or Al, which has a melting point lower than that of a refractory metal such as W can be used.

Furthermore, if the thick ceramic substrate 11 is used, since the substrate can be easily treated, the process required for the formation of the chip-through plug 13 is facilitated.

Although the excess portion of the conductive paste 13 is removed by polishing in this embodiment, this portion may be removed by etching such as RIE or CDE.

Note that the excess portion of the conductive paste 13 can be reliably removed by CMP regardless of the amount of the excess portion of the conductive paste 13 and its planarization before polishing. The chip-through plug 13 having a flat upper portion can therefore be easily formed. If the upper portion is flat, the interconnection 14 can be easily formed on it.

(Sixth Embodiment)

FIGS. 7A to 7G are sectional views showing the steps in a method of forming a chip-through plug according to the sixth embodiment of the present invention. In this embodiment, a chip-through plug is-formed in an Si substrate (Si wafer).

As shown in FIG. 7A, an interlevel insulating film 22 is formed on an Si substrate 21 on which a device has already been formed.

As shown in FIG. 7B, the interlevel insulating film 22 and the Si substrate 21 are etched to form a trench 23 having an opening diameter of 50 μm and a depth of 200 μm.

As shown in FIG. 7C, after a 1-μm thick silicon nitride film 24 is formed on the entire surface of the trench 23 to cover it by a plasma CVD method, a multilayer metal film 25 made up of a 50-nm thick Ti film, a 300-nm thick Ni film, a 50-nm thick Pd film, and a 4-μm thick Cu film is formed on the silicon nitride film 24. In this case, the Ti, Ni, and Pd films are formed by, for example, sputtering, whereas the Cu film is formed by, for example, a plating method.

As shown in FIG. 7D, the entire surface of the resultant structure is then coated with a conductive or insulating paste 26, and the paste 26 having a thickness larger than the depth of the trench 23 is buried in the trench 23. Thereafter, a temporary hardening process is performed by volatilizing the solvent of the paste 26. At this time, a large amount of excess portion of the paste 26 remains outside the trench 23. In this case, the conductive paste 26 having a thickness smaller than the depth of the trench 23 may be buried in the trench 23 as long as the trench 23 can be entirely filled with the paste finally.

Note that since the aspect ratio of the trench 23 is high, a paste burying method described in the seventh embodiment is preferably used to prevent any void from being left in the trench 23.

Figure 7E:
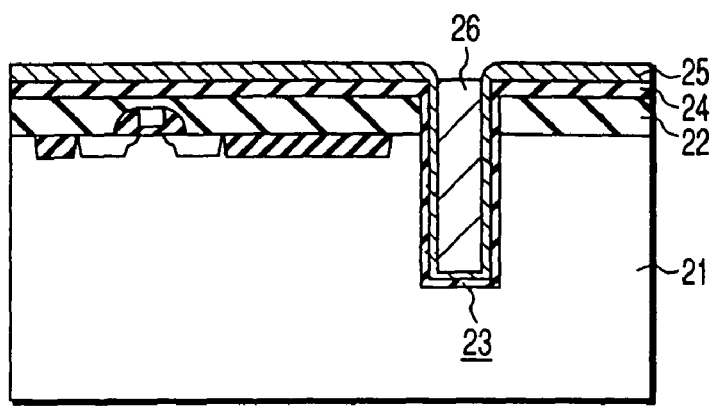

As shown in FIG. 7E, the excess portion of the paste 26 outside the trench 23 is removed by CMP. In this case, since the paste 26 has undergone only the temporary hardening process, the excess portion of the paste 26 outside the trench 23 can be easily removed by polishing with a weak force enough to destroy the resin in the paste 26. As a consequence, as in the fifth embodiment, the excess portion of the paste 26 can be removed in a very short period of time as compared with the prior art.

In addition, the excess portion of the paste 26 can be easily and selectively removed by adding a solution of the same solvent as that of the binder contained in the paste 26 or a solvent solution having a dissolving powder lower than that of the above solvent to the polishing liquid. Alternatively, instead of the solution, a weak acid or weak basic solution that dissolves the binder in the paste 26 may be added.

In this step, a certain portion of the paste 26 is preferably left outside the trench 23 for the following reason. Since the paste 26 shrinks in the next calcination step, if all the portion of the paste 26 outside the trench 23 is removed, an unfilled portion is formed in the upper portion of the trench 23 after calcination. If, however, the paste 26 does not shrink much, no problem arises even if all the portion of the paste 26 outside the trench 23 is removed.

Figure 7F:
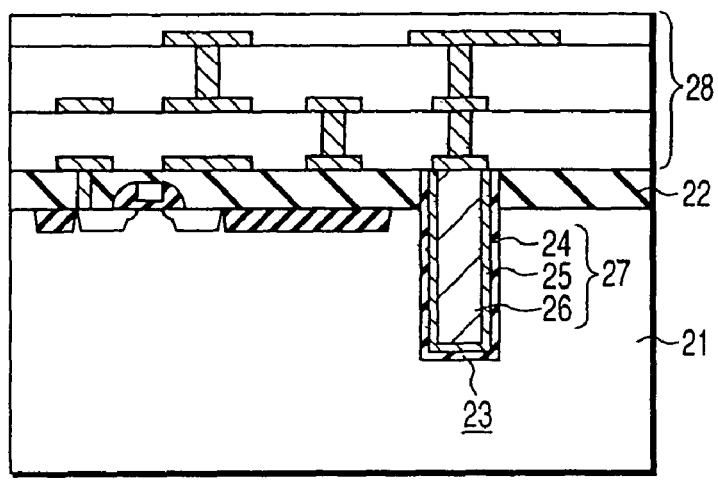

After the portion of the multilayer metal film 25 outside the trench 23 and the silicon nitride film are removed by CMP or the like, the paste 26 is calcined. The calcined paste 26, the multilayer metal film 25, and the silicon nitride film 24 constitute a chip-through plug 27. Subsequently, as shown in FIG. 7F, a multilevel interconnection 28 is formed on the Si substrate 21.

Figure 7G:
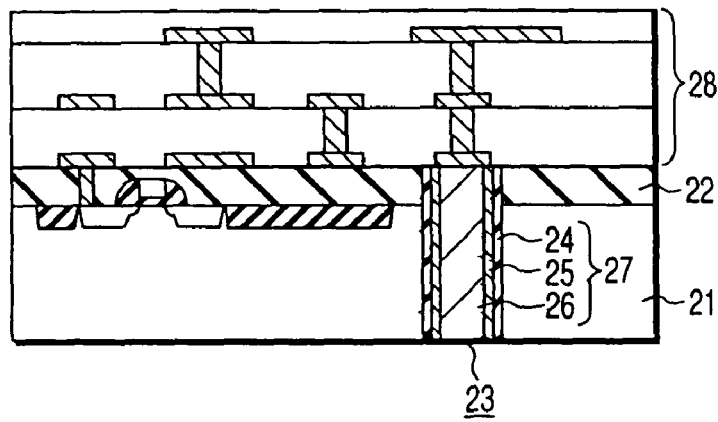

As shown in FIG. 7G, the lower surface of the Si substrate 21 is polished by CMP or the like until the chip-through plug 27 appears, thereby completing the chip-through plug 27 extending through the Si substrate 21. In this embodiment, as shown in FIG. 7G, the multilayer metal film 25 is etched when the lower surface of the substrate is polished. Even if, however, this process is performed such that the multilayer metal film 25 is left in the bottom portion of the chip-through plug 27, no problem arises. The subsequent steps are the same as those for a general multichip module. For example, the step of connecting a plurality of Si substrates 21 to each other through chip-through plugs 27 continues.

As described above, according to this embodiment, the excess portion of the paste 26 is removed in the step of temporarily hardening the paste, in which the paste can be easily removed, instead of the step after calcination in which the paste is difficult to remove. As in the first embodiment, therefore, the low-resistance chip-through plug 27 can be formed without taking much time. In addition, this embodiment can be modified in the same manner as the fifth embodiment. For example, the excess portion of the paste 26 may be removed by etching instead of polishing.

(Seventh Embodiment)

FIGS. 8A to 8D are sectional views showing the steps in a method of forming a chip-through plug according to the seventh embodiment of the present invention.

Figure 8A:
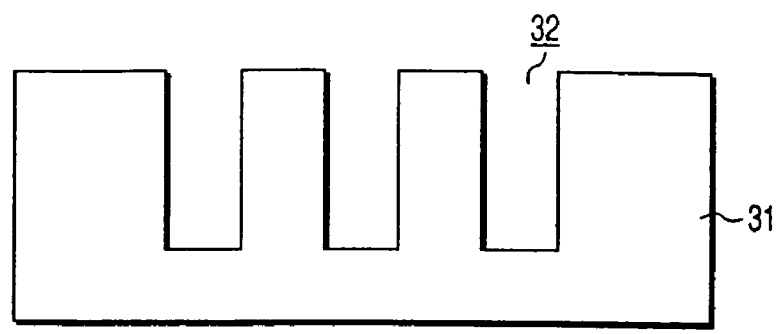
FIGS. 8A to 8D are sectional views showing the steps in a method of forming a connection plug according to the seventh embodiment of the present invention.

As shown in FIG. 8A, a trench 32 of a high aspect ratio is formed in an Si or ceramic substrate 31. For example, the trench 32 has an opening diameter of 100 μm and a depth of 150 μm.

Figure 8B:
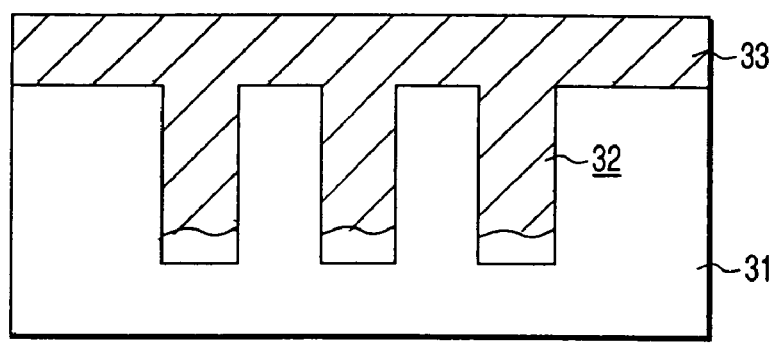

As shown in FIG. 8B, the substrate 31 is coated with an Ni paste 33, and the trench 32 is filled with the Ni paste 33 to some level from the opening surface of the trench 32. In this stage, a void (unfilled region) is present on the bottom surface side of the trench 32.

When an Si substrate is used as the substrate 31, an insulating film such as a silicon nitride film 24 for providing insulation for the Si substrate is formed in advance on the surface of the trench 32, as in the sixth embodiment. In addition, as in the sixth embodiment, the substrate may be coated with an insulating paste through a conductive film such as a multilayer metal film 25 instead of the Ni paste 33.

Figure 8C:
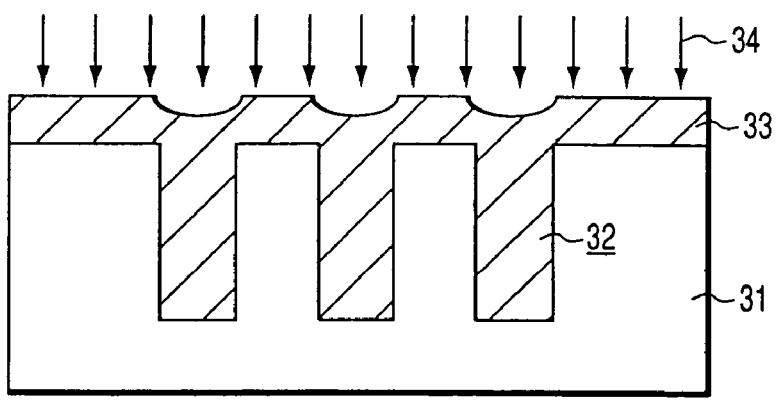
Figure 8D:
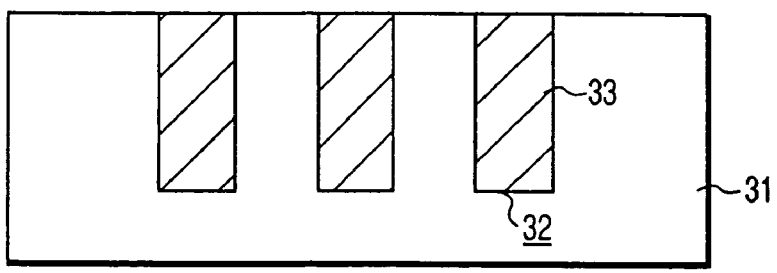

As shown in FIG. 8C, the Ni paste 33 is pressurized with $N_2$ gas 34 of a high pressure, e.g., 2 kgf/cm$^2$ to fill the void in the trench 32 with the Ni paste 33, thereby entirely filling the trench 32 with the Ni paste 33, as shown in FIG. 8D.

The subsequent steps are the same as those in the fifth and sixth embodiments. For example, a temporary hardening process is performed at a temperature of 100 to 150° C. to remove the portion of the Ni paste 33 outside the trench 32. The Ni paste 33 is then calcined at a temperature of 600° C. The lower surface of the substrate 31 is polished until this calcined Ni paste 33 appears, thereby completing a chip having the Ni paste 33 penetrating the Si substrate 33.

As described above, according to this embodiment, after the Ni paste 33 is buried in the trench 32 to a certain extent, the void in the trench 32 is filled with the Ni paste 33 by pressurizing the portion of the Ni paste 33 outside the trench 32. With this process, even if the depth (aspect ratio) of the trench 32 increases, the trench 32 can be easily filled with the Ni paste 33.

According to this embodiment, even if, therefore, the depth of the trench 32 increases, the Ni paste 33 without any void can be formed.

In this embodiment, after the substrate is coated with the Ni paste 33, the Ni paste 33 is pressurized with a gas. However, this paste may be mechanically pressurized to fill the void in the trench 32 with the Ni paste 33. Alternatively, after the substrate is coated with the Ni paste 33 under a reduced pressure, the pressure may be restored to atmospheric pressure, thereby filling the void in the trench 32 with the Ni paste 33.

The present invention is not limited to the above embodiments. For example, in each embodiment described above, the paste according to the-present invention is applied to a chip-through plug. However, this paste can be applied to other members such as damascene interconnections. Various changes and modifications of the embodiments can be made without departing from the spirit and scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method of forming an electrical interconnection by burying powder in a trench having a bottom formed in a major surface of a substrate, wherein the major surface is within the interior of the substrate above a lower surface of the substrate, comprising:

applying a dispersion of the powder in a solvent onto a region including the trench;

precipitating the powder in the dispersion within the trench to bury the trench with the precipitated powder; and polishing the lower surface of the substrate to expose the powder buried in said trench.

2. A method according to claim 1, wherein the dispersion contains a resin.

3. A method according to claim 1, wherein a portion of said powder is a glass powder.

4. A method according to claim 2, wherein a portion of said powder is a glass powder.

5. A method of forming an electrical interconnection by burying powder in a trench having a bottom formed in a major surface of a substrate, wherein the major surface is within the interior of the substrate above a lower surface of the substrate, comprising:

applying a dispersion of the powder in a solvent onto a region including the trench;

precipitating the powder in the dispersion within the trench to bury the trench with the precipitated powder, wherein the trench includes a plug hole having a bottom formed in an upper surface of said substrate, and said precipitating includes precipitating said powder within said plug hole; and said method further comprising removing the lower surface of the substrate until the powder buried at a bottom portion of said plug hole appears to form a chip-through plug.

* * * * *